United States Patent
von Malm et al.

(10) Patent No.: US 9,012,926 B2
(45) Date of Patent: Apr. 21, 2015

(54) RADIATION-EMITTING SEMICONDUCTOR COMPONENT

(75) Inventors: Norwin von Malm, Nittendorf-Thumhausen (DE); Ralph Wirth, Lappersdorf (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 396 days.

(21) Appl. No.: 13/389,661

(22) PCT Filed: Aug. 5, 2010

(86) PCT No.: PCT/EP2010/061446
§ 371 (c)(1),
(2), (4) Date: Apr. 19, 2012

(87) PCT Pub. No.: WO2011/018411
PCT Pub. Date: Feb. 17, 2011

(65) Prior Publication Data
US 2012/0193657 A1    Aug. 2, 2012

(30) Foreign Application Priority Data
Aug. 12, 2009   (DE) .......................... 10 2009 037 186

(51) Int. Cl.
*H01L 29/18* (2006.01)
*H01L 27/15* (2006.01)
*H01L 33/38* (2010.01)
*H01L 33/20* (2010.01)
(Continued)

(52) U.S. Cl.
CPC ............... *H01L 27/153* (2013.01); *H01L 33/20* (2013.01); *H01L 33/32* (2013.01); *H01L 33/08* (2013.01); *H01L 33/382* (2013.01); *H01L 33/50* (2013.01); *H01L 33/62* (2013.01); *H01L 2224/49107* (2013.01); *H01L 2924/3011* (2013.01)

(58) Field of Classification Search
CPC ................................. H01L 33/21; H01L 33/20
USPC ....................................................... 257/79, 88
See application file for complete search history.

(56) References Cited

U.S. PATENT DOCUMENTS 5,998,925 A   12/1999  Shimizu et al.
6,603,146 B1   8/2003  Hata et al.
(Continued)

FOREIGN PATENT DOCUMENTS

DE         297 24 458 U1    4/2001
DE    10 2007 022 947 A1   10/2008
(Continued)

*Primary Examiner* — Ha Tran T Nguyen
*Assistant Examiner* — Aaron Dehne
(74) *Attorney, Agent, or Firm* — Slater & Matsil, L.L.P.

(57) ABSTRACT

A radiation-emitting semiconductor component includes a light-emitting diode chip with at least two emission regions that can be operated independently of each other and at least two differently designed conversion elements. During operation of the light-emitting diode chips each of the emission regions is provided for generating electromagnetic primary radiation. Each emission region has an emission surface by which at least part of the primary radiation is decoupled from the light-emitting diode chip. The conversion elements are provided for absorbing at least part of the primary radiation and for re-emitting secondary radiation. The differently designed conversion elements are disposed downstream of different emission surfaces. An electric resistance element is connected in series or parallel to at least one of the emission regions.

20 Claims, 4 Drawing Sheets

(51) Int. Cl.
*H01L 33/32* (2010.01)
*H01L 33/08* (2010.01)
*H01L 33/50* (2010.01)
*H01L 33/62* (2010.01)

(56) References Cited

U.S. PATENT DOCUMENTS

2007/0241349 A1 10/2007 Kishioka
2007/0252512 A1 11/2007 Bertram et al.
2008/0083929 A1* 4/2008 Fan et al. .................... 257/79
2008/0272712 A1* 11/2008 Jalink et al. ................. 315/291
2009/0242902 A1* 10/2009 Lowery ....................... 257/79
2010/0171135 A1 7/2010 Engl et al.

FOREIGN PATENT DOCUMENTS

| EP | 1 840 979 A2 | 10/2007 |
| JP | 10-261818 A | 9/1998 |
| WO | WO 2007/034367 A1 | 3/2007 |
| WO | WO 2009/019836 A2 | 2/2009 |

* cited by examiner

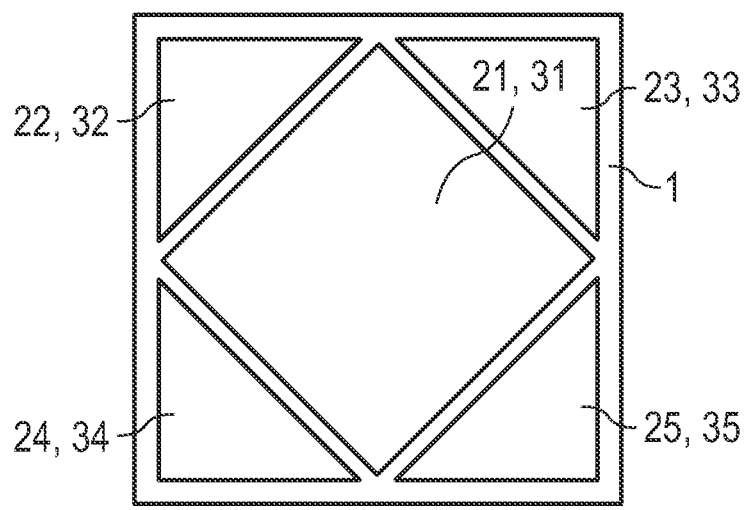
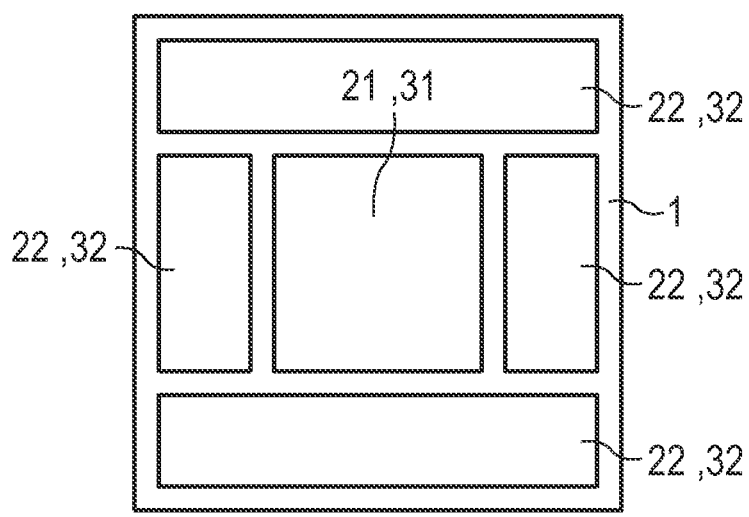

RADIATION-EMITTING SEMICONDUCTOR COMPONENT

This patent application is a national phase filing under section 371 of PCT/EP2010/061446, filed Aug. 5, 2010, which claims the priority of German patent application 10 2009 037 186.9, filed Aug. 12, 2009, each of which is incorporated herein by reference in its entirety.

TECHNICAL FIELD

A radiation-emitting semiconductor component is specified.

U.S. Patent publication 2007/0252512 A1 describes a radiation-emitting semiconductor component.

BACKGROUND

In order to generate mixed-colored, in particular white, light with light-emitting diode chips, it is possible to use conversion elements in the beam path of the primary radiation emitted by the light-emitting diode chip, in order to convert part of the short-wave primary radiation into longer-wave secondary radiation.

The intensity ratio of primary radiation to secondary radiation determines the emission color of the emitted light. In practice, firstly the wavelengths of the primary radiation from different light-emitting diode chips differ, even if the latter are produced jointly and originate from a single wafer, for example, and secondly the optical thicknesses of the conversion elements differ, such that an undesired distribution of the resulting emission color appears.

This problem could be solved by sorting light-emitting diode chips from a sufficiently large production volume by measuring light-emitting diode chips having emission colors within specific desired limits (so-called binning). The resultant rejects that cannot be utilized have the effect that this method can be implemented economically only in a restricted fashion.

SUMMARY OF THE INVENTION

In one aspect a radiation-emitting semiconductor component is specified wherein the color of the emitted light can be set.

In accordance with at least one embodiment of the radiation-emitting semiconductor component, the semiconductor component comprises a light-emitting diode chip. The light-emitting diode chip comprises at least two emission regions which can be operated independently of one another.

That is to say that the light-emitting diode chip is separated into at least two emission regions which can be operated independently of one another. In the emission regions, electromagnetic radiation can be generated at identical or at different times. Furthermore, the emission regions can be energized with different current intensities, such that electromagnetic radiation having mutually different intensities can be generated by the emission regions.

In accordance with at least one embodiment of the radiation-emitting semiconductor component, the light-emitting diode chip comprises at least two differently configured conversion elements. In this case, "differently configured" means that the conversion elements, if they are irradiated with electromagnetic radiation having the same wavelength and the same intensity, emit mutually different secondary radiation. By way of example, the conversion elements can differ from one another with regard to their geometrical dimensions such as, for example, their thickness, and/or their composition. By way of example, a first conversion element can contain a first phosphor, while the second conversion element contains a second phosphor. Moreover, the concentration of the phosphors of different conversion elements can differ.

In accordance with at least one embodiment of the semiconductor component, each of the emission regions of the light-emitting diode chip is provided for generating electromagnetic primary radiation during operation. The emission regions can each have an active zone, for example, in which electromagnetic radiation can be generated during the operation of the light-emitting diode chip. The emission regions can have active zones formed in the same fashion, such that the primary radiation generated in the emission regions in each case has the same wavelength.

The emission regions can be produced, for example, by the structuring of a contact of the light-emitting diode chip. Preferably, the contact which has the poorer transverse conductivity is structured in this case. The emission regions can then comprise a common active layer extending through all the emission regions, such that the active zones of the emission regions are constructed in the same fashion.

The structuring of the contact can be realized by the complete absence of the contact at the locations between the emission regions. Furthermore, it is possible for locations having a high contact resistance to be present between the emission regions, the locations leading to an electrical decoupling of the emission regions. Furthermore, it is possible that, for the purpose of separating the light-emitting diode chip into a plurality of emission regions, the semiconductor body of the light-emitting diode chip itself is structured, such that, for example, an active layer is severed.

In accordance with at least one embodiment of the semiconductor component, each emission region of the light-emitting diode chip has an emission area, through which at least part of the primary radiation is coupled out from the light-emitting diode chip. The emission areas are arranged, for example, in a main area of the light-emitting diode chip at the top side thereof.

In accordance with at least one embodiment of the semiconductor component, the conversion elements are provided for absorbing at least part of the primary radiation and for re-emitting secondary radiation. By way of example, the primary radiation is electromagnetic radiation from the wavelength range of blue light. The conversion elements can then be provided for re-emitting yellow light as secondary radiation. Primary radiation and secondary radiation can mix to form white light.

In accordance with at least one embodiment of the semiconductor component, differently configured conversion elements are disposed downstream of different emission areas of the light-emitting diode chip. That is to say that at least two of the emission regions of the light-emitting diode chip each have an emission area, wherein a conversion element is disposed downstream of each emission area and the conversion elements differ from one another in terms of their configuration. In this way, the mixed light emitted from the two emission areas also differs from one another.

In accordance with at least one embodiment of the radiation-emitting semiconductor component, the radiation-emitting semiconductor component comprises an electrical resistance element. The electrical resistance element is a structural element having a predeterminable, preferably adjustable, electrical resistance. The electrical resistance element is connected in series or in parallel at least with one of the emission regions. In this case, the semiconductor component can also have a plurality of electrical resistance elements which can be assigned to different emission regions.

By way of example, the emission regions of the light-emitting diode chip can be interconnected in series or in parallel. In order to be able to set the intensity ratio of the primary radiation emitted by the emission regions, in the case of the series connection electrical resistance elements can be connected in parallel with the emission regions, and in the case of the parallel connection electrical resistance elements can be connected in series with the emission regions. In this case, the parallel connection of the emission regions affords the advantage of a common cathode or anode, which can reduce the outlay for the production of the light-emitting diode chip of the semiconductor component.

By way of example, the radiation-emitting semiconductor component is provided, during operation, for emitting white light, wherein blue light, for example, generated in the emission regions is at least partly wavelength-converted by the conversion elements in such a way that white light results. The emission regions are preferably connected in parallel with one another in this case, and the resistance element is connected in series. In this case, it proves to be particularly advantageous if the resistance element is connected in series upstream of an emission region downstream of whose emission area is disposed a conversion element which converts the light generated by the emission region or the electromagnetic radiation generated by the emission region to a lesser extent than other conversion elements present in the semiconductor component. By way of example, for this purpose, the conversion element is made thinner or the concentration of a phosphor is lower in this conversion element than in other conversion elements. In other words, the resistance element is connected in series with an emission region which, together with its conversion element, emits, for example, bluer light than other pairs of emission regions and conversion elements or than all other pairs of emission regions and conversion elements of the semiconductor component. It has now been found that this measure can at least partly compensate for the change in efficiency of the conversion element as the temperature increases. Furthermore, during the dimming of the component, this measure leads to a shift in the color temperature in the direction of warm white, which is perceived to be pleasant by the user of the semiconductor component.

A radiation-emitting semiconductor component is specified which comprises a light-emitting diode chip and an electrical resistance element. The light-emitting diode chip comprises at least two emission regions which can be operated independently of one another, and the electrical resistance element is connected in series or in parallel with at least one of the emission regions. The light-emitting diode chip furthermore comprises at least two differently configured conversion elements. Each of the emission regions of the light-emitting diode chip is provided for generating electromagnetic primary radiation during operation, and each emission region has an emission area, through which at least part of the primary radiation is coupled out from the light-emitting diode chip. The conversion elements are provided for absorbing at least part of the primary radiation and for re-emitting secondary radiation, wherein the differently configured conversion elements are disposed downstream of different emission areas.

Therefore, in accordance with at least one embodiment, a semiconductor component is specified which comprises a segmented light-emitting diode chip having at least two emission regions, the emission regions of which are electrically drivable separately from one another. Conversion elements for the emission regions can have different emission wavelengths and/or different emission intensities. In accordance with a first measurement, the intensities of the primary radiation generated in the emission regions can be set by means of the electrical resistance element. Overall, a semiconductor component wherein a total emission of defined color can be set is specified in this way.

In this case, it is also possible, in particular, for no conversion element to be disclosed downstream of at least one emission area of an emission region. During operation, by way of example, unconverted, for example, blue light is then emitted by the assigned emission area. The remaining emission area or the remaining emission areas can then comprise a conversion element or conversion elements which overconvert a little. That is to say that mixed light emitted by these pairs of emission regions with emission areas and conversion elements is shifted slightly in the direction of the color of the light emitted by the conversion element. In this way, firstly, a large change in color can be achieved with a small change in resistance and, secondly, it is possible to employ high resistance values for the series resistance, which leads to an improved efficiency of the semiconductor component.

In the present radiation-emitting semiconductor component, it is possible, in accordance with at least one embodiment, for the electrical resistance element to be a structural element that is spatially separated from the light-emitting diode chip. By way of example, the light-emitting diode chip for each emission region can comprise at least one contact location to which an external electrical resistance element can be connected. The electrical resistance element can then have an adjustable resistance, for example, such that the radiation-emitting semiconductor component constitutes a color-tunable light source.

By way of example, the electrical resistance element in this embodiment can be arranged on a common carrier of light-emitting diode chip and electrical resistance element. Such a carrier can be, for example, a circuit board on which further electronic devices such as an electronic memory unit, for example, are also arranged. By means of the memory unit, different driving patterns and intensity ratios for the primary radiation generated by the emission regions can be stored and retrievable for the operation of the radiation-emitting semiconductor component.

In accordance with at least one embodiment of the radiation-emitting semiconductor component, the resistance element is integrated into the light-emitting diode chip. For this purpose, the resistance element can be integrated, for example, into a carrier for the emission regions of the light-emitting diode chip. Furthermore, it is possible for the resistance element to be arranged on an outer area of the light-emitting diode chip. Both cases allow a radiation-emitting semiconductor component which is constructed particularly compactly.

In accordance with at least one embodiment of the radiation-emitting semiconductor component, the resistance element is embodied as a layer applied to an outer area of the light-emitting diode chip. The layer can be embodied, for example, as a metal layer or as a layer composed of a doped semiconductor material. The layer can be applied, for example, directly to the semiconductor body of the light-emitting diode chip. By way of example, the layer is applied to that main area of the light-emitting diode chip which also comprises the emission areas of the individual emission regions. That is to say that the layer is arranged on the light-emitting diode chip, for example, at the top side thereof.

Furthermore, it is possible for the resistance element to be arranged below the emission areas. The resistance element can be arranged, for example, between the light-emitting diode chip and a carrier.

In accordance with at least one embodiment of the radiation-emitting semiconductor component, the layer forming the resistance element has a multiplicity of electrically conductive sections. The electrically conductive sections are, for example, embodied in strip-type fashion and connected to one another at least in locations. By way of example, the sections of the layer can form a net-like grid. At least one of the sections can be severed for setting the resistance of the resistance element. No current can then flow through the section during the operation of the light-emitting diode chip. The severing of at least one of the electrically conductive sections reduces the number of electrically conductive connections between two connection locations of the resistance element, such that the electrical resistance of the resistance element can be increased by the severing.

Alternatively, the resistance can also be changed by predetermined electrically conductive partial structures being at least partly connected to one another. The conductive connections can be applied, for example, by means of conductive adhesive materials or electrolytically.

In accordance with at least one embodiment of the radiation-emitting semiconductor component, a conversion element is disposed downstream of each emission area of the light-emitting diode chip, wherein the primary radiation and the secondary radiation in each case mix to form white mixed light. That is to say that, in this embodiment, the light-emitting diode chip emits white mixed light from each emission area. The mixed light of the individual emission areas in turn mixes to form a total light for the observer. In this case, the mixed light of different emission areas can differ with regard to its color locus and/or its color temperature and/or its brightness.

In accordance with at least one embodiment of the radiation-emitting semiconductor component, differently configured conversion elements differ with regard to their thicknesses. In this case, the thickness of the conversion element is measured, for example, in a direction running perpendicularly to the first main area of the light-emitting diode chip, in which the emission areas of the light-emitting diode chip are also situated. In order to produce the differently configured conversion elements, by way of example, the same conversion element can be applied to all the emission areas, wherein the thickness of the conversion element is adjustable, for example, by injection molding in gradated molds or by material removal over an emission area, for example, by grinding or sawing with gradated tools or by location-selective removal by means of etching or ablation.

As an alternative or in addition to the use of conversion elements having different thicknesses, it is also possible for conversion elements having a different material composition to be used. Furthermore, the use of multilayered conversion elements is possible, wherein, by way of example, different layers of the conversion element can comprise different phosphors. In the case of such conversion elements, too, the color locus of the resulting mixed light can be set by setting the thickness of the individual layers of the conversion element. By way of example, the conversion element can be a laminated-together, multilayered conversion element having different thicknesses of its layers over different emission areas. Alternatively, it is possible to place mutually different conversion elements onto different emission areas, the conversion elements being present in the form of ceramic laminae, for example, which can consist of a ceramic phosphor.

In accordance with at least one embodiment of the radiation-emitting semiconductor component, at least one of the emission areas is enclosed in a lateral direction by at least one other emission area. In this case, the lateral direction is that direction which runs parallel to the first main area of the light-emitting diode chip, which also comprises the emission areas.

By way of example, the light-emitting diode chip comprises an emission area arranged centrally on the first main area. Further emission areas or a further emission area are or is arranged around the first emission area. Such an arrangement of emission areas can contribute to the fact that mixed-light mixing of the total light of the light-emitting diode chip already takes place at the chip level, such that the light-emitting diode chip appears to emit uniformly in the far field. Additional optical elements for light mixing such as, for example, diffusely scattering screens can then be dispensed with. By enclosing at least one emission area by at least one other emission area in a lateral direction, therefore, a radiation-emitting semiconductor component is realized wherein the total light is emitted more homogeneously than would be the case, for example, for the arrangement of emission areas along a straight line.

A strip-type arrangement of the individual emission areas, wherein the emission areas are in each case embodied as strips arranged parallel to one another, for example, can also lead to a radiation-emitting semiconductor component wherein the total light is emitted particularly homogeneously.

In accordance with at least one embodiment of the radiation-emitting semiconductor component, at least one conductor track for making contact with at least one of the emission regions of the light-emitting diode chip is arranged below at least one emission area. This embodiment has the advantage, inter alia, that the first main area of the light-emitting diode chip can be utilized particularly efficiently for coupling out electromagnetic radiation, since the emission areas are not reduced by conductor tracks on the first main area. Contact with the light-emitting diode chip can then also be made from only one side, for example from the underside or the top side.

BRIEF DESCRIPTION OF THE DRAWINGS

The radiation-emitting semiconductor component described here is explained in greater detail below on the basis of exemplary embodiments and the associated figures.

With reference to the schematic illustration in FIGS. 1A, 1B, 1C, 2A, 2B, 2C, 2D and 3, various exemplary embodiments of the radiation-emitting semiconductor component described here are described in greater detail.

Elements that are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1A:
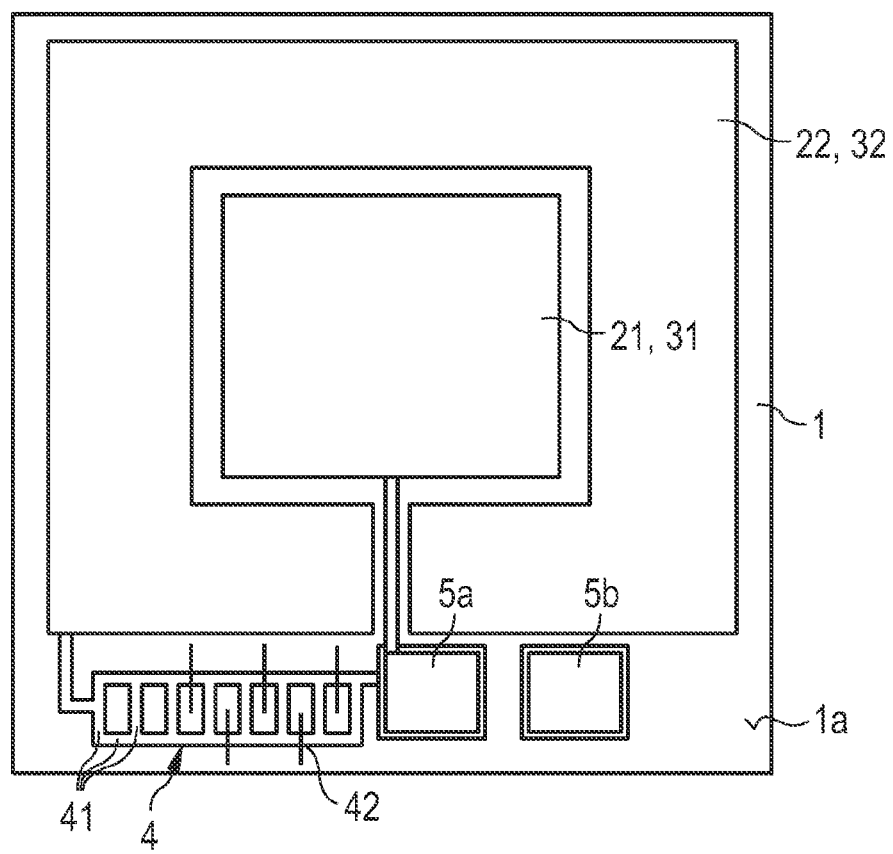

FIG. 1A shows a radiation-emitting semiconductor component described here in a schematic plan view.

The radiation-emitting semiconductor component comprises a light-emitting diode chip 1. In this exemplary embodiment, the light-emitting diode chip 1 has two emission areas 21, 22. The first emission area 21 is arranged centrally in a first main area 1a at the top side of the light-emitting diode chip 1. The first emission area 21 is enclosed in a lateral direction at least in places by the second emission area 22.

A conversion element 31, 32 is disposed downstream of each emission area, wherein the two conversion elements differ from one another. By way of example, the conversion elements are formed with different thicknesses. During the operation of the light-emitting diode chip 1, mixed light can be emitted from the emission areas 21, 22 at the same times, the mixed light being composed of the respective primary radiation and the respective secondary radiation.

The radiation-emitting semiconductor component furthermore comprises an electrical resistance element 4. In the present case, the electrical resistance element 4 is integrated into the light-emitting diode chip by virtue of being arranged onto an outer area of the light-emitting diode chip, namely of the first main area 1a. The resistance element 4 is embodied as a metal layer having a multiplicity of electrically conductive sections 41 arranged in a grid-like fashion. The metal layer consists of gold, nickel or platinum, for example, which is deposited on to the semiconductor body of the light-emitting diode chip 1. The resistance element 4 furthermore has severings 42 which sever some of the electrically conductive sections 41 in such a way that no current flows through the sections during the operation of the light-emitting diode chip. The sections 41 can be severed, for example, by melting or thermal decomposition of the section 41. This is possible, for example, by impressing a high current or by bombardment by laser beam.

The resistance of the resistance element 4 can furthermore be set as follows. First, the light-emitting diode chip 1 is coated with photoresist whilst still in the wafer assembly after a first measurement of the semiconductor chip. Preferably, in this case all the light-emitting diode chips 1 in the wafer assembly are coated with photoresist. Afterward, chip-selectively, that is to say individually for each light-emitting diode chip 1, the photoresist is exposed at the locations to be separated or connected of, for example, the electrically conductive sections 41, for example, by means of laser direct writing. This is followed by separation of the resistance elements defined in this way by etching or connection by electrolytic growth of metals or by areal coating, for example, by means of evaporation with metals and subsequent lift-off of the photoresist.

In an alternative method, a film with a metallic coating can be placed over the wafer, and this metallic coating is then transferred to the wafer by a laser pulse or by laser pulses at the locations of the resistance element that are to be connected. That is to say that the connections are produced by means of laser-induced metal transfer.

A semiconductor material can also be used as an alternative to a metal for forming the sections of the resistance element. The electrical resistance of a resistance element formed with a semiconductor material can then also be implemented by corresponding doping, for example, by ion bombardment, of the semiconductor material. Such a resistance element can, for example, also be integrated into a carrier for the emission regions of the light-emitting diode chip.

Figure 1B:
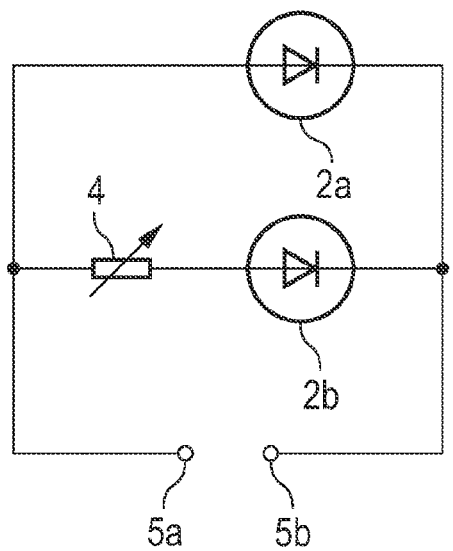
Figure 1C:
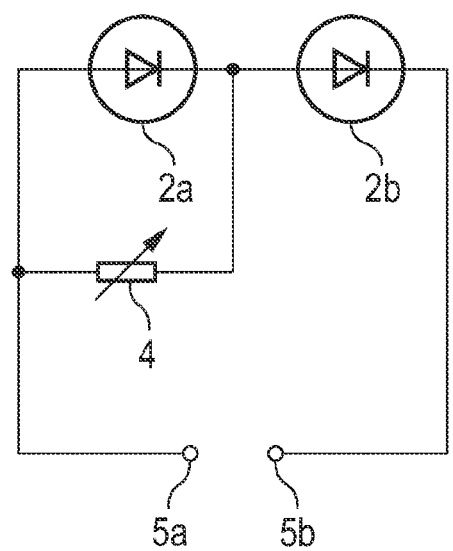

Different possibilities for interconnecting the emission regions 2a, 2b of the light-emitting diode chip 1 with the resistance element 4 are shown on the basis of the schematic circuit arrangements in FIGS. 1B and 1C. In both cases, contact is made with the emission regions 2a, 2b via the contact locations 5a, 5b. In the exemplary embodiment in FIG. 1B, the emission regions are connected in parallel, and the resistance element 4 is connected in series with one of the emission regions 2a, 2b. In this case, it is also possible for a resistance element 4 likewise to be connected in series with the other emission region.

In the exemplary embodiment in FIG. 1C, the emission regions 2a, 2b are connected in series, and a resistance element 4 is connected in parallel with one of the emission regions 2a.

FIGS. 2A to 2D show, in schematic plan views, further exemplary embodiments of radiation-emitting semiconductor components described here.

In the exemplary embodiment in FIG. 2A, a centrally arranged emission area 21 with the assigned conversion element 31 is surrounded by four further emission areas 22, 23, 24, 25, downstream of which corresponding conversion elements 32, 33, 34, 35 are disposed. Such a radiation-emitting semiconductor component therefore comprises five different emission regions with different conversion elements. From each of the emission areas, white mixed light can be emitted, wherein the mixed light from the different emission areas can differ with regard to the color locus, the color temperature and/or the brightness.

In the exemplary embodiment in FIG. 2B, an emission area 21 with the assigned conversion element 31 is laterally enclosed by a further emission area 22 with the assigned conversion element 32.

Figure 2C:
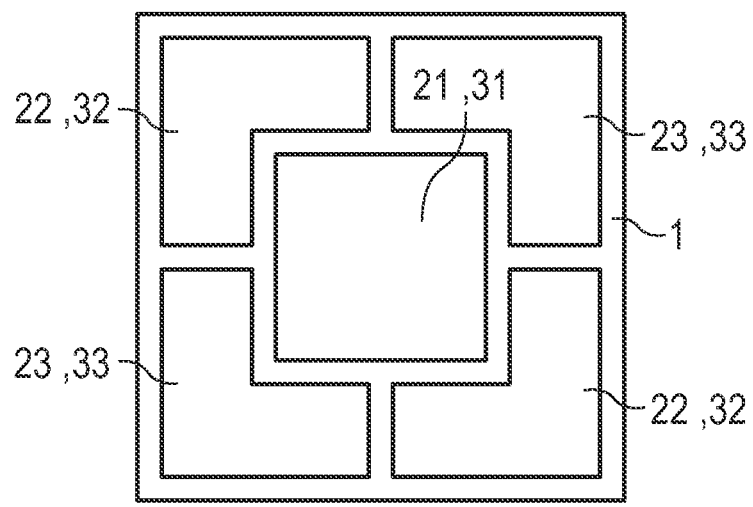

In the exemplary embodiment in FIG. 2C, the light-emitting diode chip 1 of the radiation-emitting semiconductor component has three different emission areas with assigned conversion elements.

Figure 2D:
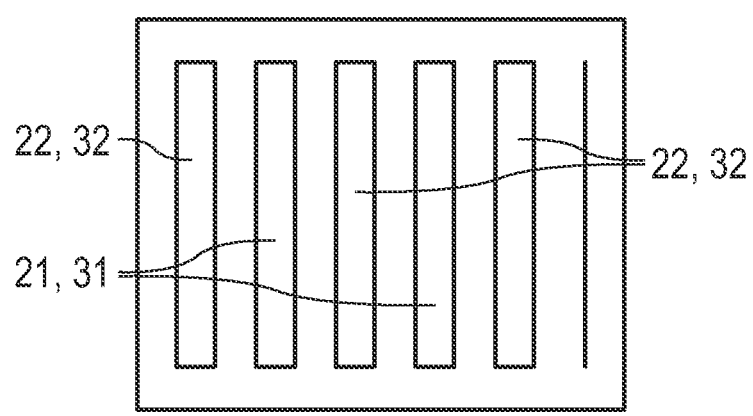

In the exemplary embodiment in FIG. 2D, the light-emitting diode chip 1 of the radiation-emitting semiconductor component has two different emission areas 21, 22 with assigned conversion elements 31, 32, which are in each case embodied in strip-type fashion. In this case, the individual strips run parallel to one another and are arranged alternately. From each of the emission areas 21, 22, white mixed light can be emitted, wherein the mixed light from the different emission areas can differ with regard to the color locus, the color temperature and/or the brightness. In this case, the strip-like arrangement allows particularly good mixing of the emitted light.

Overall, the light-emitting diode chips of the radiation-emitting semiconductor component described here can be embodied very flexibly with regard to their emission regions, the assigned emission areas and the assigned conversion elements. A plurality of different emission areas can be accommodated on a relatively small space, such that a uniform color impression of the emitted total light, which constitutes a superimposition of the mixed lights from the individual emission areas, arises even without a further optical element in the far field.

Figure 3:
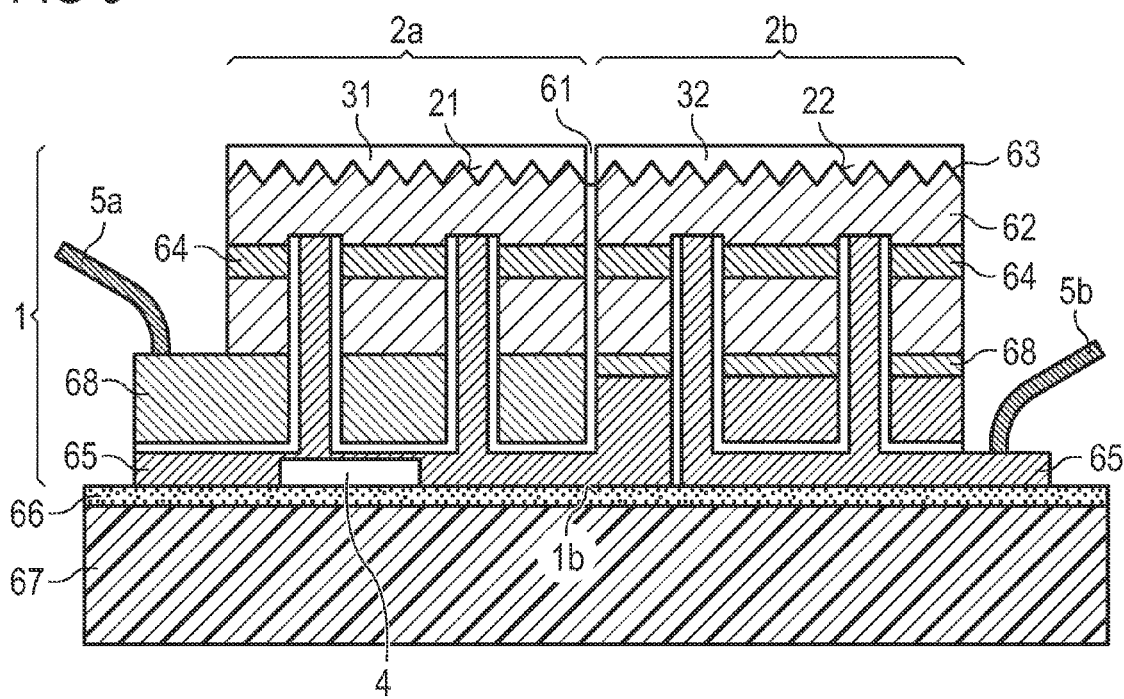

In conjunction with the schematic sectional illustration in FIG. 3, an exemplary embodiment of a radiation-emitting semiconductor component described here is explained in greater detail, wherein conductor tracks 65 for making contact with the emission regions 2a, 2b of the light-emitting diode chip 1 are arranged below the emission areas 21, 22.

In this exemplary embodiment, the light-emitting diode chip 1 comprises two emission regions 2a, 2b. The emission regions 2a, 2b are electrically decoupled from one another by electrically insulating separating layers 61.

The contact location 5a is electrically conductively connected to the conductor track 65 running below the emission area 21 of the emission region 2a. The contact location 5b is electrically conductively connected to the conductor track 65 running below the emission area 22 of the emission region 2b.

The electric current is impressed into the active zones 64 of the emission regions 2a, 2b from the conductor track 65 via current spreading layers 62, for example.

The emission areas 21, 22 can comprise roughenings 63, for example, which increase the probability of emergence of electromagnetic radiation.

Furthermore, the emission regions can each comprise mirrors 68 provided for reflecting electromagnetic radiation toward the emission areas 21, 22.

In the present case, the light-emitting diode chip 1 furthermore comprises a carrier 67, which is connected to the further regions of the light-emitting diode chip 1 by means of a connecting material 66. The carrier can be embodied in electrically insulating fashion.

Similar contact-making schemes in which conductor tracks run below emission areas are explained in greater detail, for example, in the German publication DE 10 2007 022 947 A1, the disclosure contact of which is hereby expressly incorporated by reference.

A resistance element 4 is arranged below the emission areas 21, 22. The resistance element 4 is arranged between the light-emitting diode chip 1 and the carrier 67. In the present case, the electrical resistance element 4 is integrated into the light-emitting diode chip, in which it is arranged on to an outer area of the light-emitting diode chip, namely the second main area 1b at the underside of the light-emitting diode chip 1. The resistance element 4 is embodied as a metal layer having a multiplicity of electrically conductive sections 41 arranged in a grid-like manner (in this respect, also see FIG. 1A).

Alternatively, it is also possible for the resistance element 4 to be integrated into the carrier 67 below the light-emitting diode chip 1. In any case, the resistance element 4 is then covered by the light-emitting diode chip and does not lead to a reduction of the emission area of the light-emitting diode chip 1. The resistance element 4 is then therefore arranged below the emission areas 21, 22 of the light-emitting diode chip 1.

The invention is not restricted to the exemplary embodiments by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A radiation-emitting semiconductor component comprising:
    a light-emitting diode chip having a plurality of emission regions that can be operated independently of one another, the light emitting diode chip further having a first main area which is a part of an outer area of the light-emitting diode chip,
    a plurality of differently configured conversion elements, wherein
        each of the emission regions is configured to generate electromagnetic primary radiation during operation of the light-emitting diode chip,
        each emission region has an emission area through which at least part of the primary radiation is coupled out from the light-emitting diode chip,
        the conversion elements are configured to absorb at least part of the primary radiation to-re-emit secondary radiation,
        the differently configured conversion elements are disposed downstream of different emission areas, and
    an electrical resistance element coupled in series or in parallel with at least one of the emission regions;
    wherein the resistance element comprises a layer located at an outer area of the light-emitting diode chip; and
    wherein the plurality of conversion elements and the layer of the resistance element are arranged on a same first main area.

2. The radiation-emitting semiconductor component according to claim 1, wherein the resistance element is located at an outer area of the light-emitting diode chip.

3. The radiation-emitting semiconductor component according to claim 1, wherein the resistance element is arranged below the emission areas of the light-emitting diode chip.

4. The radiation-emitting semiconductor component according to claim 1, wherein the layer has a plurality of electrically conductive sections, wherein at least one of the sections is severed for setting a resistance of the resistance element, such that no current flows through the plurality of electrically conductive sections during operation of the light-emitting diode chip.

5. The radiation-emitting semiconductor component according to claim 1, wherein the layer is arranged on a main area of the light-emitting diode chip that also comprises the emission areas.

6. The radiation-emitting semiconductor component according to claim 1, wherein the layer is arranged on a main area of the light-emitting diode chip that lies opposite the emission areas.

7. The radiation-emitting semiconductor component according to claim 1, wherein the layer consists of a metal.

8. The radiation-emitting semiconductor component according to claim 1, wherein the layer consists of a doped semiconductor material, wherein a resistance of the resistance element is set by doping and/or severing of sections of the layer.

9. The radiation-emitting semiconductor component according to claim 1, further comprising a conversion element disposed downstream of each emission area, wherein the primary radiation and the secondary radiation respectively mix to form white mixed light.

10. The radiation-emitting semiconductor component according to claim 1, wherein the differently configured conversion elements differ with regard to their thickness.

11. The radiation-emitting semiconductor component according to claim 1, wherein white mixed light is emitted from each emission area during operation of the light-emitting diode chip, wherein the mixed light from at least two different emission regions differs with regard to color locus and/or color temperature and/or brightness.

12. The radiation-emitting semiconductor component according to claim 1, wherein at least one emission area is enclosed in a lateral direction by at least one other emission area.

13. The radiation-emitting semiconductor component according to claim 1, further comprising a conductor track that makes contact with at least one emission region of the light-emitting diode chip, the conductor track arranged below the at least one emission area.

14. A radiation-emitting semiconductor component comprising:
    a light-emitting diode chip having at least two emission regions that can be operated independently of one another, the light emitting diode chip further having a first main area which is a part of an outer area of the light-emitting diode chip, at least two differently configured conversion elements, wherein
- each of the emission regions is configured to generate electromagnetic primary radiation during operation of the light-emitting diode chip,
- each emission region has an emission area, through which at least part of the primary radiation is coupled out from the light-emitting diode chip,
- the conversion elements are configured to absorb at least part of the primary radiation and to re-emit secondary radiation, and
- the differently configured conversion elements are disposed downstream of different emission areas, and an electrical resistance element coupled in series or in parallel with at least one of the emission regions, wherein the resistance element comprises a layer located at an outer area of the light-emitting diode chip, wherein the at least two differently configured conversion elements and the layer of the resistance element are arranged on a same first main area, and wherein the layer has a plurality of electrically conductive sections, wherein at least one of the conductive sections is severed for setting a resistance of the resistance element, such that no current flows through the conductive sections during operation of the light-emitting diode chip.

15. The radiation-emitting semiconductor component according to claim 14, wherein the layer consists of a doped semiconductor material or a metal.

16. The radiation-emitting semiconductor component according to claim 14, wherein the layer consists of a doped semiconductor material, wherein the resistance of the resistance element is set by doping in addition to severing the conductive sections.

17. The radiation-emitting semiconductor component according to claim 14, wherein the layer is arranged on a main area of the light-emitting diode chip that also comprises the emission areas.

18. The radiation-emitting semiconductor component according to claim 14, wherein the layer is arranged on a main area of the light-emitting diode chip that lies opposite the emission areas.

19. The radiation-emitting semiconductor component according to claim 1, wherein the plurality of conversion elements and said layer are in direct contact with a semiconductor body of the light-emitting diode chip.

20. The radiation-emitting semiconductor component according to claim 14, wherein the at least two differently configured conversion elements and said layer are in direct contact with a semiconductor body of the light-emitting diode chip.

* * * * *

UNITED STATES PATENT AND TRADEMARK OFFICE
CERTIFICATE OF CORRECTION

PATENT NO. : 9,012,926 B2  
APPLICATION NO. : 13/389661  
DATED : April 21, 2015  
INVENTOR(S) : Norwin von Malm It is certified that error appears in the above-identified patent and that said Letters Patent is hereby corrected as shown below:

On the Title page, Item (73) Assignee, line 1, delete "OSRAM Opto Semiconductor GmbH" and insert --OSRAM Opto Semiconductors GmbH--.

Signed and Sealed this
Twentieth Day of October, 2015

Michelle K. Lee
*Director of the United States Patent and Trademark Office*